United States Patent [19]
Bernstein et al.

[11] Patent Number: 5,496,436
[45] Date of Patent: Mar. 5, 1996

[54] COMB DRIVE MICROMECHANICAL TUNING FORK GYRO FABRICATION METHOD

[75] Inventors: Jonathan J. Bernstein, Medfield; Marc S. Weinberg, Needham, both of Mass.

[73] Assignee: The Charles Stark Draper Laboratory, Inc., Cambridge, Mass.

[21] Appl. No.: 259,989

[22] Filed: Jun. 15, 1994

Related U.S. Application Data

[62] Division of Ser. No. 870,414, Apr. 7, 1992, Pat. No. 5,349,855.

[51] Int. Cl.$^6$ ........................ H01L 21/306.5; H01L 21/00
[52] U.S. Cl. ........................ 156/628.1; 156/633.1; 156/643.1; 156/656.1; 156/657.1; 437/228; 437/233; 437/245
[58] Field of Search ................ 156/628.1, 633.1, 156/643.1, 651.1, 656.1, 657.12, 659.11, 662.1; 73/505; 437/228, 233, 245; 216/33, 41, 67, 75, 79

[56] References Cited

U.S. PATENT DOCUMENTS

| | | | |
|---|---|---|---|
| Re. 32,931 | 5/1989 | Staudte | 73/505 |
| Re. 33,479 | 12/1990 | Juptner et al. | 73/505 |

(List continued on next page.)

FOREIGN PATENT DOCUMENTS

| | | | |
|---|---|---|---|
| 55-121728 | 9/1980 | Japan | H03H 9/19 |
| 58-136125 | 8/1983 | Japan | H03H 9/17 |
| 59-03772 | 3/1984 | Japan | H03H 9/17 |
| 59-158566 | 9/1984 | Japan | H01L 29/84 |
| 61-144576 | 7/1986 | Japan | G01P 15/09 |
| 62-071256 | 8/1987 | Japan | H01L 27/06 |
| 62-221164 | 9/1987 | Japan | H01L 29/84 |
| 63-169078 | 7/1988 | Japan | H01L 29/84 |
| 2183040 | 5/1987 | United Kingdom | G01F 15/02 |
| 92/01941 | 2/1992 | WIPO | G01P 9/04 |
| 93/05401 | 3/1993 | WIPO | G01P 9/04 |

OTHER PUBLICATIONS

J. Bernstein et al., "A Micromachined Comb–Drive Tuning Fork Rate Gyroscope", IEEE Micro Electro Mechanical Systems, IEEE Catalog No. 93CH3265-6, ©1993, pp. 143–148.

Barth, P. W. et al., "A Monolithic Silicon Accelerometer With Integral Air Damping and Overrange Protection," 1988 IEEE, pp. 35–38.

Boxenhorn, B., et al., "An Electrostatically Rebalanced Micromechanical Accelerometer," AIAA Guidance, Navigation and Control Conference, Boston, Aug. 14–16, 1989, pp. 118–122.

(List continued on next page.)

*Primary Examiner*—William Powell
*Attorney, Agent, or Firm*—Weingarten, Schurgin, Gagnebin & Hayes

[57] ABSTRACT

A microfabricated, tuning fork rate sensitive structure and drive electronics in which vibrational forces are communicated through a set of meshing drive and driven finger electrodes associated with each of two vibrating elements. The vibrating elements are supported in a rotatable assembly between first and second support electrodes which are in turn suspended by flexures for rotation about an axis passing through the flexures and through a point midway between the vibrating elements. Additional masses are formed onto the vibrating elements to improve overall sensor sensitivity. Sense electrodes for detecting capacitive changes between the support electrodes and the sense electrodes are positioned at each end of the support electrodes. Drive electronics are connected between the driven fingers of the vibrating elements and the drive electrode fingers which mesh with them to cause vibration. Excitation is provided between the support electrodes and the sense electrodes. Any change in signal resulting from rotation of the assembly and the resulting variation in capacitance between the support electrodes and the sense electrodes is sensed as a measure of inertial rate. A torque loop may be additionally formed using the sense electrodes in order to re-torque the assembly to a neutral position in a torque-to-balance loop.

14 Claims, 10 Drawing Sheets

U.S. PATENT DOCUMENTS

| | | | |
|---|---|---|---|
| 3,053,095 | 9/1962 | Koril et al. | 73/504 |
| 3,251,231 | 5/1966 | Hunt et al. | 73/505 |
| 3,370,458 | 2/1968 | Dillon | 73/141 |
| 3,696,429 | 10/1972 | Tressa | 343/180 |
| 3,913,035 | 10/1975 | Havens | 331/107 R |
| 4,044,305 | 8/1977 | Oberbeck | 324/154 R |
| 4,122,448 | 10/1978 | Martin | 343/7.7 |
| 4,144,764 | 3/1979 | Hartzell, Jr. | 73/497 |
| 4,155,257 | 5/1979 | Wittke | 73/497 |
| 4,234,666 | 11/1980 | Gursky | 428/573 |
| 4,321,500 | 3/1982 | Paros et al. | 310/321 |
| 4,336,718 | 6/1982 | Washburn | 73/517 B |
| 4,342,227 | 8/1982 | Petersen et al. | 73/510 |
| 4,381,672 | 5/1983 | O'Connor et al. | 73/505 |
| 4,406,992 | 9/1983 | Kurtz et al. | 338/2 |
| 4,411,741 | 10/1983 | Janata | 204/1 T |
| 4,414,852 | 11/1983 | McNeill | 73/765 |
| 4,447,753 | 8/1984 | Ochiai | 310/312 |
| 4,468,584 | 8/1984 | Nakamura et al. | 310/370 |
| 4,478,076 | 10/1984 | Bohrer | 73/204 |
| 4,478,077 | 10/1984 | Bohrer et al. | 73/204 |
| 4,483,194 | 11/1984 | Rudolf | 73/517 R |
| 4,484,382 | 11/1984 | Kawashima | 29/25.35 |
| 4,490,772 | 12/1984 | Blickstein | 361/281 |
| 4,495,499 | 1/1985 | Richardson | 343/5 DD |
| 4,499,778 | 2/1985 | Westhaver et al. | 74/5 F |
| 4,502,042 | 2/1985 | Wuhrl et al. | 340/568 |
| 4,522,072 | 6/1985 | Sulouff et al. | 73/765 |
| 4,524,619 | 6/1985 | Staudte | 73/505 |
| 4,538,461 | 9/1985 | Juptner et al. | 73/505 |
| 4,585,083 | 4/1986 | Nishiguchi | 177/229 |
| 4,590,801 | 5/1986 | Merhav | 73/510 |
| 4,592,242 | 6/1986 | Kempas | 74/5 F |
| 4,596,158 | 6/1986 | Strugach | 74/5 F |
| 4,598,585 | 7/1986 | Boxenhorn | 73/505 |
| 4,600,934 | 7/1986 | Aine et al. | 357/26 |
| 4,619,001 | 10/1986 | Kane | 455/192 |
| 4,621,925 | 11/1986 | Masuda et al. | 356/350 |
| 4,628,283 | 12/1986 | Reynolds | 331/68 |
| 4,629,957 | 12/1986 | Walters et al. | 318/662 |
| 4,639,690 | 1/1987 | Lewis | 331/96 |
| 4,644,793 | 2/1987 | Church | 73/505 |
| 4,651,564 | 3/1987 | Johnson et al. | 73/204 |
| 4,653,326 | 3/1987 | Danel et al. | 73/517 R |
| 4,654,663 | 3/1987 | Alsenz et al. | 340/870.3 |
| 4,665,605 | 5/1987 | Kempas | 29/434 |
| 4,670,092 | 6/1987 | Motamedi | 156/643 |
| 4,671,112 | 6/1987 | Kimura et al. | 73/505 |
| 4,674,180 | 6/1987 | Zavracky et al. | 29/622 |
| 4,674,319 | 6/1987 | Muller et al. | 73/23 |
| 4,674,331 | 6/1987 | Watson | 73/505 |
| 4,679,434 | 7/1987 | Stewart | 73/517 B |
| 4,680,606 | 7/1987 | Knutti et al. | 357/26 |
| 4,699,006 | 10/1987 | Boxenhorn | 73/517 AV |
| 4,705,659 | 11/1987 | Bernstein et al. | 264/29.6 |
| 4,706,374 | 11/1987 | Murkami | 437/225 |
| 4,712,439 | 12/1987 | North | 74/84 R |
| 4,727,752 | 3/1988 | Peters | 73/517 AV |
| 4,735,506 | 4/1988 | Pavlath | 356/350 |
| 4,736,629 | 4/1988 | Cole | 73/517 R |
| 4,743,789 | 5/1988 | Puskas | 310/316 |
| 4,744,248 | 5/1988 | Stewart | 73/505 |
| 4,744,249 | 5/1988 | Stewart | 73/505 |
| 4,747,312 | 5/1988 | Herzl | 73/861.38 |
| 4,750,364 | 7/1988 | Kawamura et al. | 73/510 |
| 4,761,743 | 8/1988 | Wittke | 364/484 |
| 4,764,244 | 8/1988 | Chitty et al. | 156/630 |
| 4,776,924 | 10/1988 | Delapierre | 156/647 |
| 4,783,237 | 11/1988 | Aine et al. | 437/15 |
| 4,789,803 | 12/1988 | Jacobsen et al. | 310/309 |
| 4,792,676 | 12/1988 | Hojo et al. | 250/231 GY |
| 4,805,456 | 2/1989 | Howe et al. | 731/517 AV |
| 4,808,948 | 2/1989 | Patel et al. | 331/4 |
| 4,834,538 | 5/1989 | Heeks et al. | 356/350 |
| 4,851,080 | 7/1989 | Howe et al. | 156/647 |
| 4,855,544 | 8/1989 | Glenn | 200/61.45 R |
| 4,869,107 | 9/1989 | Murakami | 73/517 R |
| 4,882,933 | 11/1989 | Petersen et al. | 73/517 R |
| 4,884,446 | 12/1989 | Ljung | 73/505 |
| 4,890,812 | 1/1990 | Chechile et al. | 248/674 |
| 4,893,509 | 1/1990 | MacIver et al. | 73/517 AV |
| 4,898,032 | 2/1990 | Voles | 73/505 |
| 4,899,587 | 2/1990 | Staudte | 73/505 |
| 4,900,971 | 2/1990 | Kawashima | 310/361 |
| 4,901,586 | 2/1990 | Blake et al. | 73/862.59 |
| 4,916,520 | 4/1990 | Kurashima | 357/71 |
| 4,922,756 | 5/1990 | Henrion | 73/517 R |
| 4,929,860 | 5/1990 | Hulsing, II et al. | 310/366 |
| 4,981,359 | 1/1991 | Tazartes et al. | 356/350 |
| 5,001,383 | 3/1991 | Kawashima | 310/367 |
| 5,016,072 | 5/1991 | Greiff | 357/26 |
| 5,025,346 | 6/1991 | Tang | 361/283 |
| 5,038,613 | 8/1991 | Takenaka et al. | 73/510 |
| 5,045,152 | 9/1991 | Sickafus | 156/653 |
| 5,060,039 | 10/1991 | Weinberg et al. | 357/26 |
| 5,090,809 | 2/1992 | Ferrar | 356/350 |
| 5,094,537 | 3/1992 | Karpinski, Jr. | 356/350 |
| 5,138,883 | 8/1992 | Pacuet et al. | 73/504 |
| 5,195,371 | 3/1993 | Greiff | 73/505 |
| 5,203,208 | 4/1993 | Bernstein | 73/505 |
| 5,205,171 | 4/1993 | O'Brien et al. | 73/517 B |
| 5,216,490 | 6/1993 | Greiff et al. | 73/517 R |
| 5,226,321 | 7/1993 | Varnham et al. | 73/505 |
| 5,233,874 | 8/1993 | Putty et al. | 73/517 AV |
| 5,241,861 | 9/1993 | Hulsing, II | 73/505 |

OTHER PUBLICATIONS

Boxenhorn, B., et al., "Micromechanical Inertial Guidance System and its Application," *Fourteenth Biennial Guidance Test Symposium*, vol. 1, Oct. 3–5, 1989, pp. 113–131.

Boxenhorn, B., et al., "Monolithic Silicon Accelerometer," *Transducers '89*, Jun. 25–30, 1989, pp. 273–277.

Boxenhorn, B., et al., "A Vibratory Micromechanical Gyroscope," AIAA Guidance, Naviagation and Control Conference, Minneapolis, Aug. 15–17, 1988, pp. 1033–1040.

Howe, R., et al., "Silicon Micromechanics: Sensors and Actuators On a Chip," IEEE Spectrum, Jul. 1990, pp. 29–35.

Moskalik, L., "Tensometric Accelerometers with Overload Protection," Meas. Tech (USA), vol. 22, No. 12, Dec. 1979 (publ. May 1980), pp. 1469–1471.

Nakamura, M., et al., "Novel Electrochemical Micro–Machining and Its Application for Semiconductor Acceleration Sensor IC," *Digest of Technical Papers* (1987) Institute of Electrical Engineers of Japan, pp. 112–115.

Petersen, K. E. et al., "Micromechanical Accelerometer Integrated with MOS Detection Circuitry," IEEE, vol. ED–29, No. 1 (Jan. 1982), pp. 23–27.

Petersen, Kurt E., et al., "Silicon as a Mechanical Material," *Proceedings of the IEEE*, vol. 70, No. 5, May 1982, pp. 420–457.

"Quartz Rate Sensor Replaces Gyros," *Defense Electronics*, Nov. 1984, p. 177.

Rosen, Jerome, "Machining In the Micro Domain," *Mechanical Engineering*, Mar. 1989, pp. 40–46.

Teknekron Sensor Development Corporation, article entitled "Micro–Vibratory Rate Sensor," 1080 Marsh Road, Menlo Park, Calif. 94025, 2 pages, undated.

Bryzek, Janusz et al., "Micromachines on the March," IEEE Spectrum, May 1994, pp. 20–31.

COMB DRIVE MICROMECHANICAL TUNING FORK GYRO FABRICATION METHOD

This application is a division of application Ser. No. 07/870,414, filed Apr. 7, 1992, now U.S. Pat. No. 5,349,855.

FIELD AND BACKGROUND OF THE INVENTION

The present invention relates to micromechanical microfabricated inertial rate sensors and in particular to a vibrating tuning fork rate sensor. Micromechanical inertial rate sensors are known either of a gyroscopic structure in which a double gimbal system utilizes a vibrating gimbal element, or a tuning fork structure utilizes a vibrating set of tuning forks for sensing inertial rates about an input axis and providing a corresponding motional change or rotation of the suspended element that can be detected to provide an indication of inertial rate, Such microfabricated devices hold a promise for large scale production and therefore low cost, The quest in such devices centers on the desire for improved sensitivity or increased signal to noise ratio in order to increase the range of applications where such devices may be used as well as a reduction in the fabrication steps to reduce overall processing complexity and cost as well as to improve the yield in the manufacture of such devices from silicon wafers using photolithograpic techniques well known in the art of semiconductor manufacture.

SUMMARY OF THE INVENTION

According to the teaching of the present invention there is provided a microfabricated tuning fork inertial rate sensor which utilizes a pair of electrode sets comprising meshed electrode fingers for the drive and driven electrodes of each vibrating element in combination with fabrication techniques which together not only improve substantially system sensitivity and signal to noise ratio but reduce the complexity and increase the reliability of microfabrication.

In particular, an assembly comprising first and second vibrating elements supported at their ends by support electrodes and further having a plurality of driven electrodes extending orthogonally from the vibrating elements is suspended by a set of flexures from each of the opposite support electrodes to a surrounding semiconductor frame or substrate. Supported and extending from the surrounding frame or substrate is a complimentary set of drive electrode fingers which mesh or extend between the fingers of the driven electrodes of the vibrating elements providing substantial overlap and an increased capacitive area therebetween. The vibrating elements are substantially linear, microfabricated elements which extend parallel to and on opposite sides of the axis through the flexures. Additional mass is provided by microfabricating it onto a side of the vibrating elements opposite to the driven fingers extending therefrom.

Four sense and/or torque electrodes are typically buried in the supporting and underlying semiconductor substrate or frame under opposite ends of the support elements for the vibrating elements. Sense and drive electronics are connected to the sense electrodes, the drive fingers and to the flexure supported assembly. The drive electronics sets the vibrating elements into opposed vibration which couples an input rate about an axis orthogonal to the support axis through the flexures into a rotational vibration of the suspended assembly about the flexures. This motion produces a signal resulting from the variation in capacitance between the support electrodes and the underlying sense electrodes which the sense electronics utilizes as an indication of input rate and, optionally, to torque to rebalance the suspended assembly to a neutral position. Sense and torque electrodes are located beneath electrode supports, and alternatively directly beneath proof masses.

The microfabricated tuning fork design of the present invention utilizes a large area of capacitance between the drive and driven electrodes in combination with a high change in that capacitance per unit motion of the vibrating elements due to the meshed drive and driven finger configuration. In addition, the fabrication techniques permit the realization of more massive vibrating elements, including the auxiliary masses attached thereto, which together cooperate to increase system sensitivity substantially. Gyroscopic transducers are implemented having multiple proof masses with pairs of meshed drive and driven fingers symmetrically disposed thereabout.

Fabrication techniques which can be simplified over prior designs utilize several exemplary technologies. Among these are forming the suspended assembly and its anchoring electrodes along with the support electrodes for the drive electrode fingers of polysilicon or electroplated metal. The supported assembly may also be microfabricated by selective etching of an epitaxially grown silicon layer over a pre-existing silicon substrate with diffused sense electrodes where the structure of the assembly is defined by boron diffusion into the grown layer and subsequent etching. Wafer bonding technologies may also be utilized to deposit on top of the silicon substrate, by bonding, a highly-doped layer contributed by a second wafer which is ultimately etch removed leaving the superimposed boron doped layer to be photolithographically configured to provide the structure of the rotationally supported assembly.

In all cases the first or underlying substrate will typically be selectively diffused with a boron P+ diffusion to define the underlying sense electrodes although a surface film of polysilicon or metal may be used, or bridge electrode technology may be utilized as desired.

BRIEF DESCRIPTION OF THE DRAWING

These and other features of the present invention are more fully set forth below in the fully exemplary detailed description and accompanying drawing of which.

DETAILED DESCRIPTION OF THE INVENTION

The present invention contemplates an inertial rate sensor such as a tuning fork gyro of micromechanical fabrication in which drive and driven electrode pairs, responsible for imparting vibrational motion to the tuning fork vibrating elements, are formed by plural respective interleaved fingers which greatly increases the area and capacitance as well as capacitance change with motion of the device so as to substantially enhance the system sensitivity. In addition, such a drive structure is consistent with fabrication techniques that allow for a greater mass to the vibrating element which cooperates with the higher efficiency drive in providing an increased sensitivity. The resultant tuning fork gyro has low sensitivity to acceleration as the opposing motion of the tines (including masses), cancels out the common mode acceleration effect. The tuning fork structure has a high mechanical quality factor (Q), due to the opposing motion which tends to reduce the stress reaching the support points and hence reduce the coupling of energy out of the structure.

Figure 1:
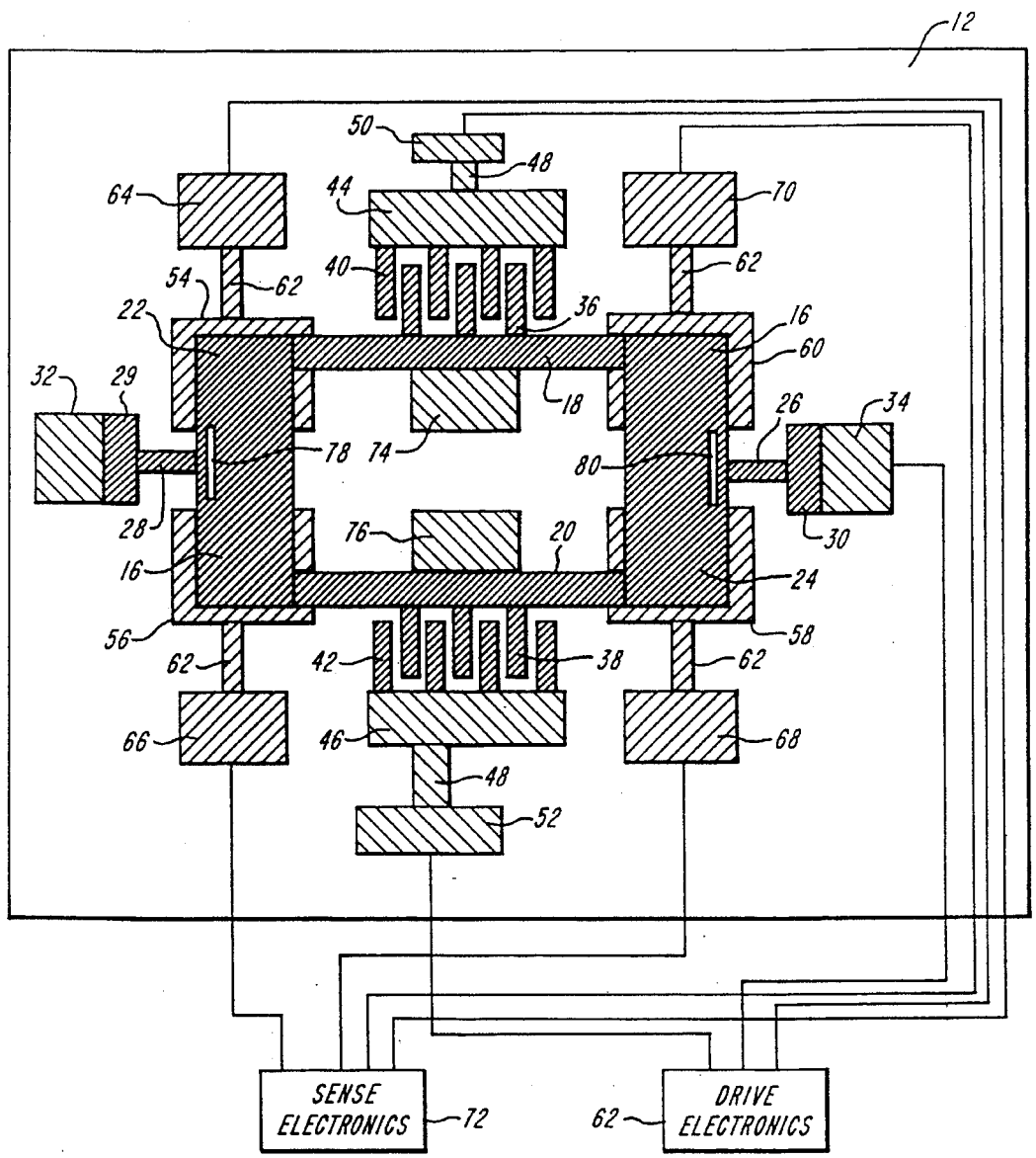
FIG. 1 is a top diagrammatic view of a micromechanical comb drive tuning fork inertial rate sensor according to a first embodiment of the invention.

According to one aspect of the invention illustrated in FIG. 1 there is shown a surface 12 of a silicon substrate 14 having suspended thereover a rotatable assembly 16 comprising first and second vibrating elements 18 and 20 which extend between electrode supports 22 and 24 therefor. Flexures 26 and 28 extend from the remote edges of the support electrodes 22 and 24 to respective support pillars 29 and 30 which are in turn tied into the surface 12 of substrate 14 through attachment or surface electrodes 32 and 34.

A rotation axis is defined by an axis extending centrally through the flexures 26 and 28. On opposite sides of the vibrating elements 18 and 20 extend driven electrode fingers 36 and 38 respectively. These are interleaved or meshed with drive electrodes 40 and 42 which extend from support elements 44 and 46 tied to the surface 12 of the substrate 14. Electrical paths 48 typically extend from the supports 44 and 46 to electrical contacts 50 and 52.

Typically, the substrate 14, of silicon in preferred form, has the surface layer 12 formed as a dielectric such as silicon dioxide from oxidation of the surface thereof. Buried and implanted slightly below the dielectric layer 12 are sense electrodes 54, 56, 58 and 60, located below the remote ends of each of the support electrodes 22 and 24 in order to sense the variation in gap between those support electrodes and the sense electrodes reflective of rotation of the assembly 16 about the axis through the flexures 28 and 26 which provide a flexural torque resistance to such rotation. Such rotation is induced, once the vibrating elements 18 and 20 have been set in motion by electrical signals applied from drive electronics 62 connected to the assembly 16 via contact 34 and the drive electrodes 40 and 42 via contacts 50 and 52 in a response to a rate input typically about an axis in the plane of the drawing of FIG. 1 and orthogonal to the axis along flexures 26 and 28. The sense electrodes 54, 56, 58 and 60 are electrically contacted through vias 62 to contacts 64, 66, 68 and 70 which extend above the surface layer 12 as metallizations extending through apertures in the dielectric layer to contact the vias 62.

Sense electronics 72 are interconnected to the assembly 16 and to sense electrodes 54, 56, 58 and 60 through their electrical contacts and vias and operate, using known technology, to process the variation in capacitance between each of the sense electrodes and the support electrodes of the assembly 16. For this purpose, the sense electronics will typically apply an oscillatory signal to the assembly 16 via the electrode 34 and differentially sense the signal on electrode pairs 54 and 60 relative to electrode pairs 56 and 58 as an indication of rotation of the assembly 16. Alternatively, one set of electrode pairs such as 54 and 56 may be used to apply rebalance torque to the substrate 16 dependant upon the magnitude of the sensed rotation utilizing known torque to balance electronics. For this purpose reference may be had to commonly assigned U.S. Patents and applications Ser. No. 07/479,854, filed Feb. 14, 1990 (CSDL-106AX), now U.S. Pat. No. 5,193,371; U.S. patent application Ser. No. 07/757,706, filed Sep. 11, 1991 (CSDL-149XX), now abandoned and U.S. Pat. No. 5,016,072, Issued May 14, 1991 (CSDL-217XX).

In order to increase the sensitivity of the rate sensor provided by the rotatable and vibrating assembly 16, additional weights or masses 74 and 76 are provided on the interfacing edge of the vibrating elements 18 and 20 away from the edge containing the driven electrodes 36 and 38. The basic mechanism of the gyroscopic action is the Coriolis force acting on the proof masses 74, 76 when the vibrating tuning fork is rotated. This causes the masses to rotate about the output axis at the drive resonant frequency. The masses may be of the same material as the rest of assembly 16 as described below or of a different material such as a higher density metal. In order to provide a stress relief in the assembly 16 between the support pillars 29 and 30 the edges of the support electrodes 22 and 24 where the flexures 28 and 26 join them are slotted with stress relief slots 78 and 80 which allow for the material internal stresses in the assembly 16, which may occur during processing by shrinkage of the polysilicon or metallization typically utilized for the fabrication of the assembly 16.

Alternative embodiments of a tuning fork rate sensitive structure are illustrated in FIGS. 1A–1D. The gyroscopic micromechanical implementation illustrated in FIG. 1A, has a center motor 110 having proof masses 112 with comb structures disposed on both sides thereof. Disposing the proof masses 112 and comb structures as illustrated with respect to the center motor 110, increases symmetry and allows both drive and sense in the in-plane resonance. The sense electrodes 114 and torque electrodes 116, in this illustrative embodiment, are disposed directly beneath the oscillating proof masses 112 (as opposed to being located beneath the electrode supports 22, 24 as illustrated in FIG. 1).

Figure 1A:
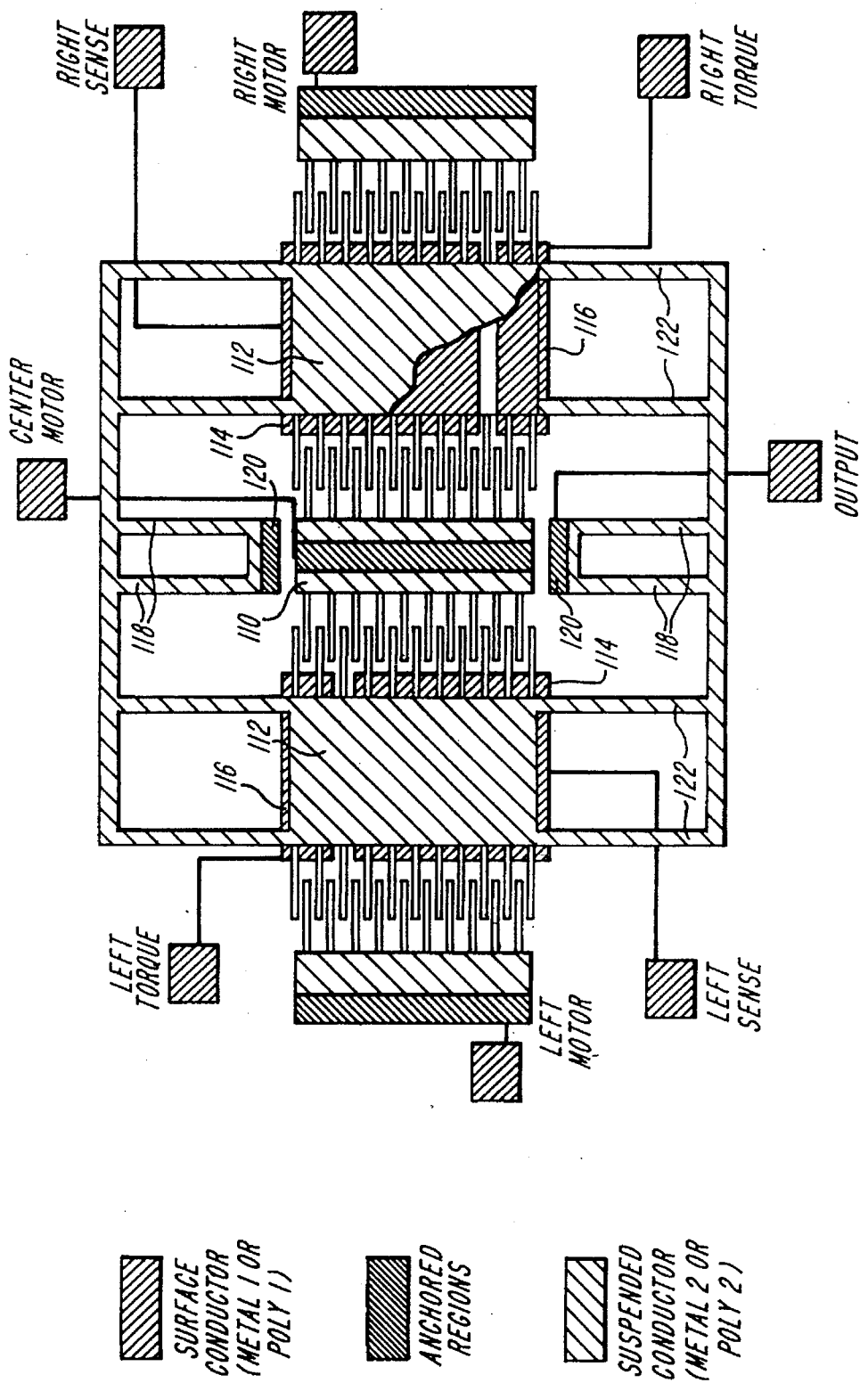
FIG. 1A is a top diagrammatic view of an alternative embodiment of a micromechanical comb drive tuning fork inertial rate sensor.

Additionally, as illustrated in FIG. 1A, multiple torsion springs 118 or flexures can be implemented, such as in pairs, to provide the rotational axis for the transducer. The torsion springs 118 have anchored regions 120 that are located inward toward the center of the device, reducing stress and increasing out-of-plane stiffness. Moving the anchored regions 120 toward the masses and device center, increases stiffness by effecting two short beams or springs which bend less, as opposed to one long spring. Similarly, multiple support springs 122 are implemented in pairs supporting the masses 112 on opposing sides thereof.

Figure 1B:
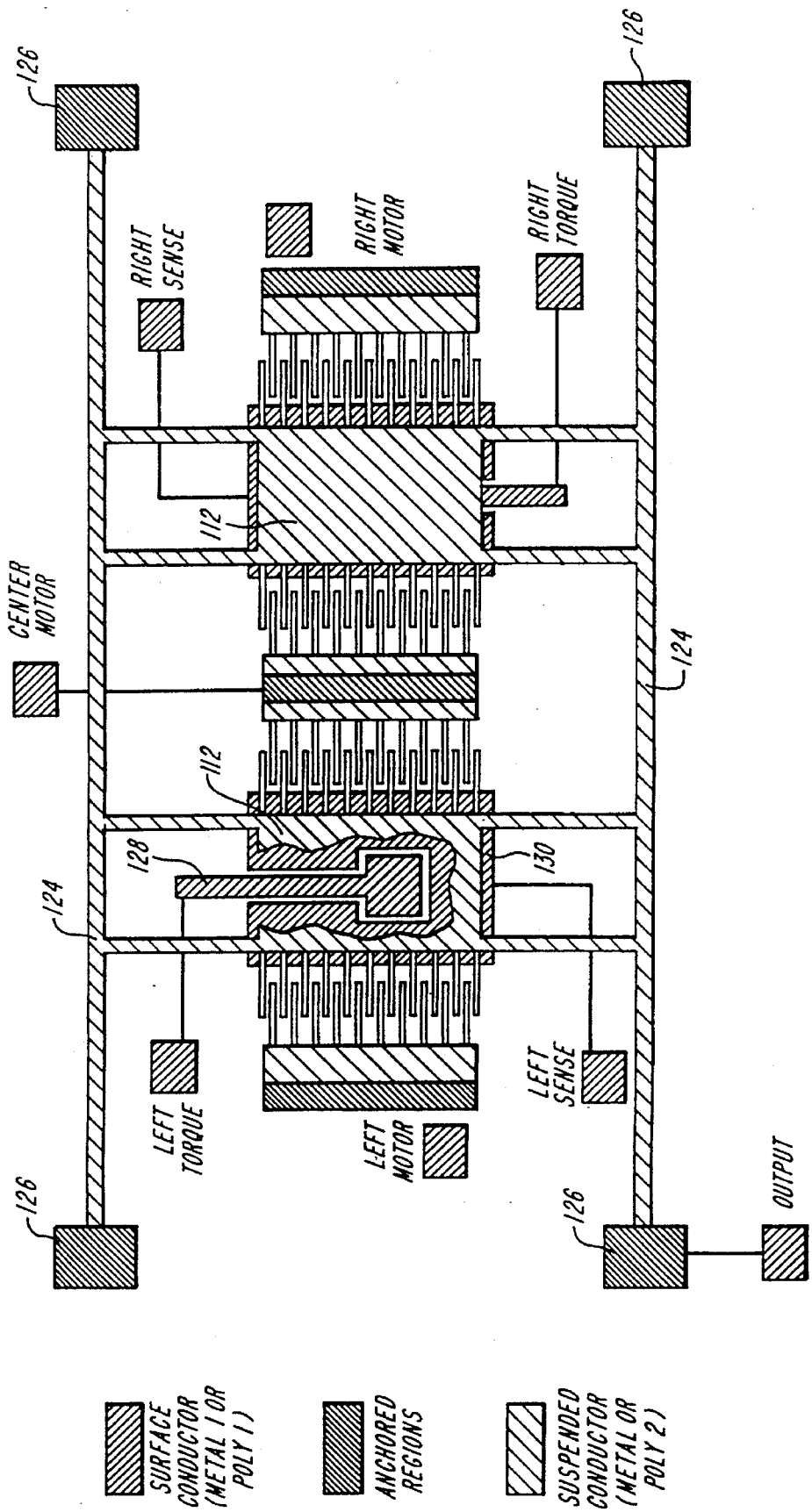
FIG. 1B is a top diagrammatic view of another alternative embodiment of a micromechanical comb drive tuning fork inertial rate sensor.

An embodiment illustrated in FIG. 1B, implements the symmetrical proof masses, including spring supports 124 which extend outwardly from the center of the device to anchored regions 126. The layout illustrated has an advantageous set of resonant modes and frequencies, and permits greater fabrication control to allow the tuning fork mode to be matched to be 5% away from the output tilt mode resonant frequency. Preferably, the structure is designed so that the drive and sense resonant frequencies are 5% apart, to yield mechanical gain near resonance on the sense axis, without coupling and coincident non-linearity, and resulting in an increase by a factor of approximately three of the signal to noise ratio of the device.

As illustrated, the embodiment in FIG. 1B also incorporates torque and sense electrodes 128 and 130, respectively, fabricated to have a common centroid beneath the proof masses 112. The torque electrode 128 is fabricated centered beneath the proof mass 112 having the sense electrode 130 disposed thereabout with a sufficient gap therebetween. The common centroid facilitates a centered electric field resulting in substantially symmetrical lines of force exerted by the torque electrode on the proof mass and greater symmetry of the capacitively sensed output.

Figure 1C:
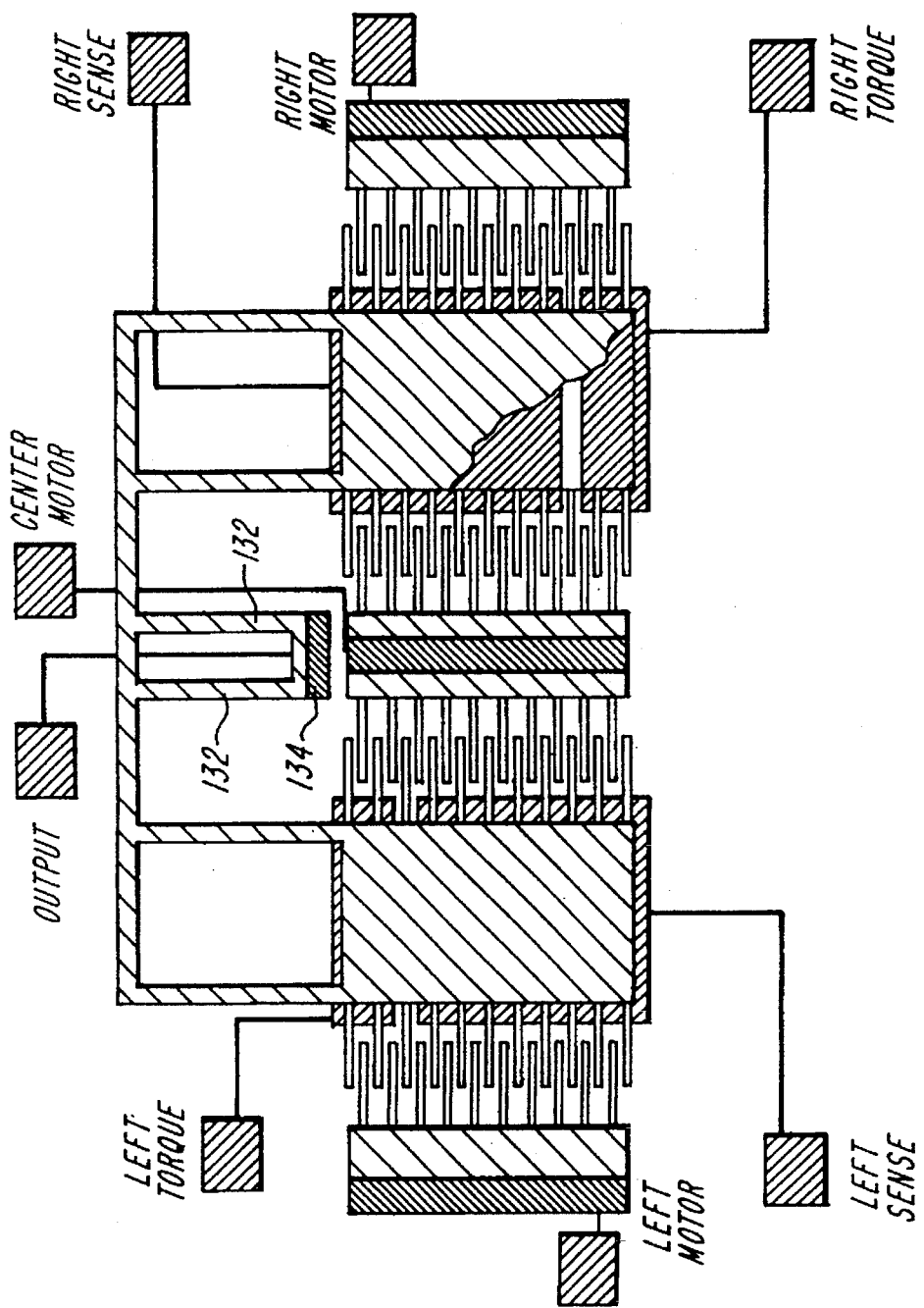
FIG. 1C is a top diagrammatic view of yet another alternative embodiment of a micromechanical comb drive tuning fork inertial rate sensor.
Figure 1D:
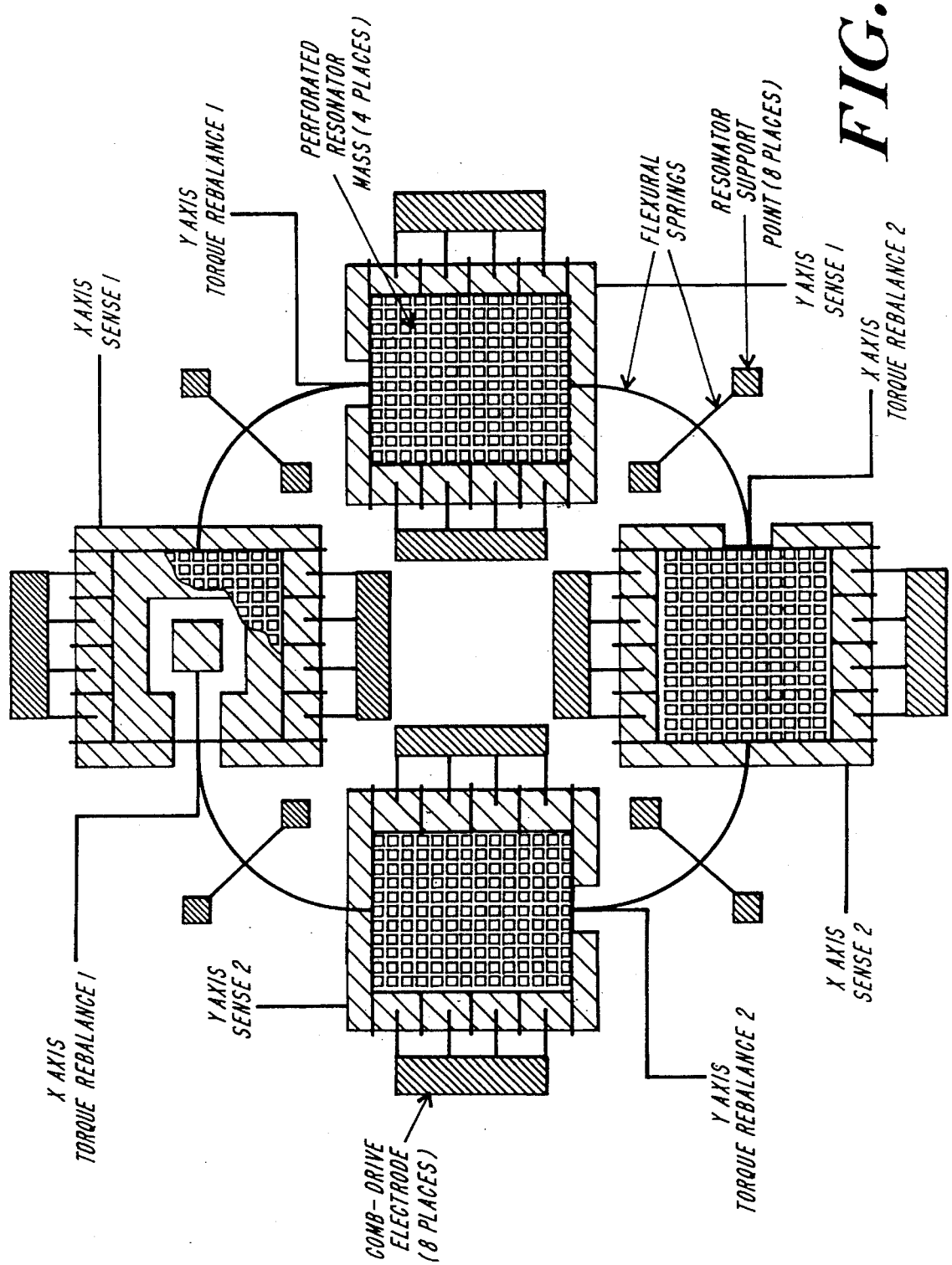
FIG. 1D is a top diagrammatic view of still another alternative embodiment of a micromechanical comb drive tuning fork inertial rate sensor.
Figure 1E:
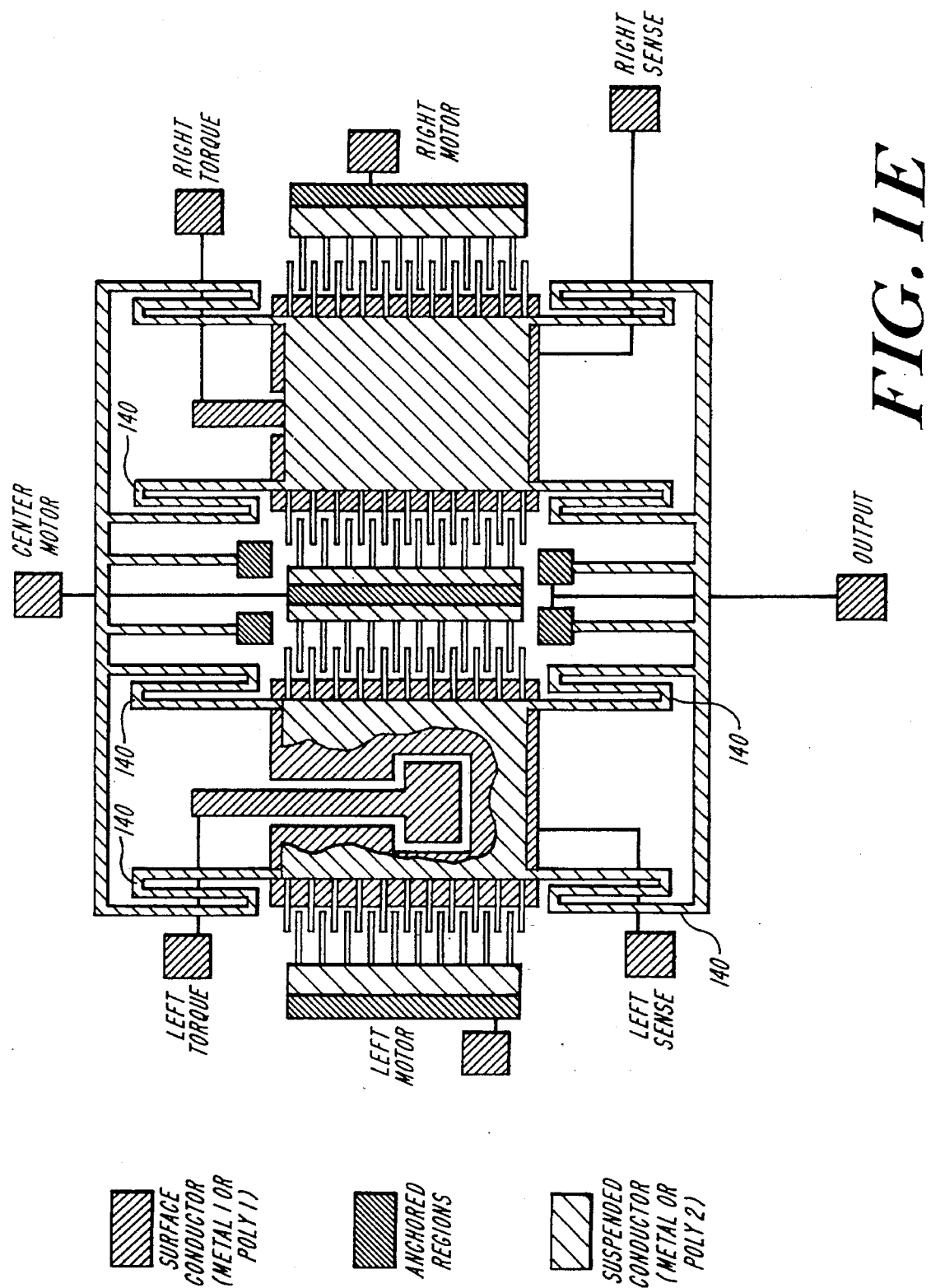
FIG. 1E is a top diagrammatic view of still another alternative embodiment of a micromechanical comb drive tuning fork inertial rate sensor.

FIGS. 1C, 1D and 1E illustrate further alternative embodiments according to the invention. FIG. 1C illustrates a cantilevered embodiment of the symmetrical proof mass gyroscopic transducer. A single pair of flexures 132 extending from a single anchored support point 134 supports the transducer element via a single spring support 136. The single ended embodiment illustrated has the same functionality as the devices discussed herein.

FIG. 1D shows that a plurality of gyroscopic transducers according to the invention can be configured to effect outputs in a plurality of axes. In this illustrative embodiment, four symmetrical transducers are configured to effect two tuning fork gyros oscillating 180 degrees out of phase. Rotation is sensed about both the X and Y axes. Advantageously, such a configuration implements mode shapes that lead to highly linear spring bending.

An embodiment that effects added horizontal compliance in a compact space is illustrated in FIG. 1E. The pair of proof masses are attached via a plurality of folded support springs 140. The proof masses each have bilaterally symmetrical torque and sense electrodes having a common centroid, as discussed hereinbefore, disposed therebeneath. The springs 140 can be folded as shown in FIG. 1E, or in alternative configurations, to yield greater compliance in the in-plane direction while minimizing the overall size of the springs.

Figure 2:
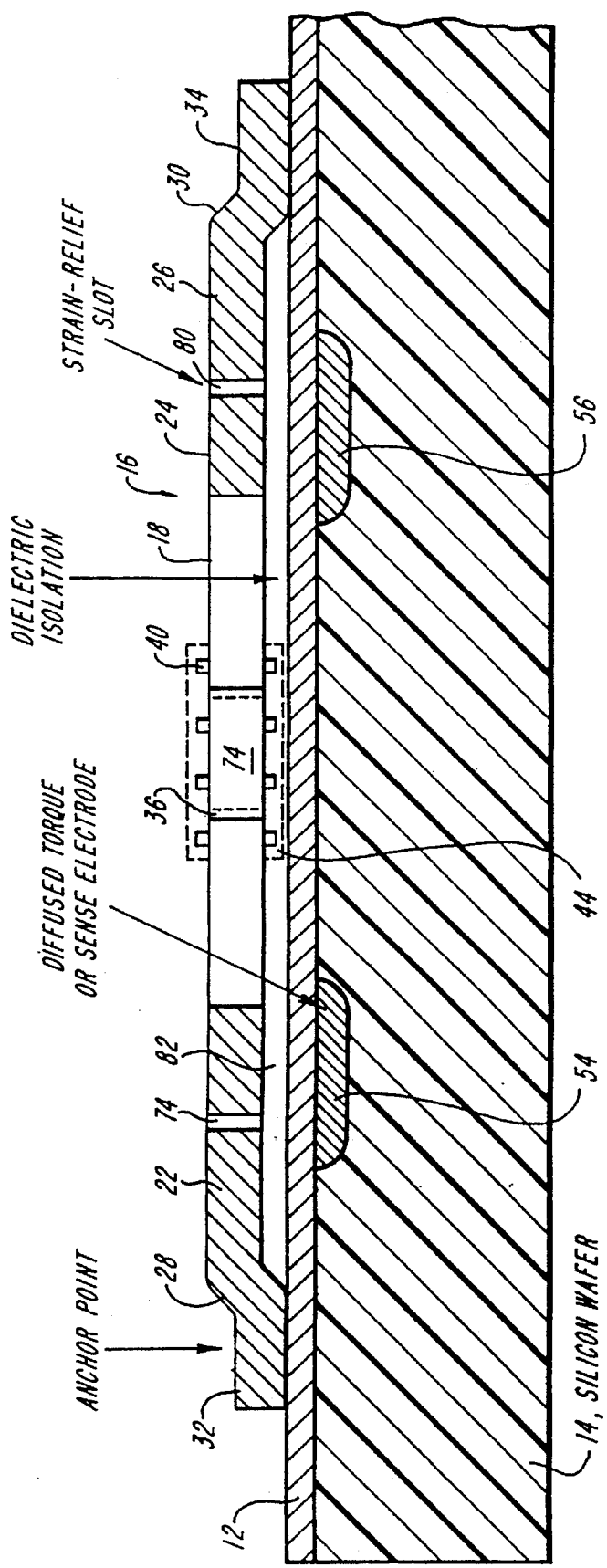
FIG. 2 is a side sectional view taken along sections of FIG. 1.

FIG. 2 illustrates one embodiment of the FIG. 1 structure fabricated by bridge construction technology in either polysilicon or metallization such as nickel or gold. The view of FIG. 2 is shown by section lines along the axis through the flexures 28 and 26 as to the assembly 16 but along a section line through the electrodes 54 and 60 as to the substrate 14 and surface 12. As illustrated in FIG. 2 sense electrodes 54 and 56 are shown below the surface layer 12 and the oxide layer thereon and are typically formed in an initial processing sequence by photolithographic technology as is represented by the above-identified patents and applications by applying, through selective apertures in a oxide layer over the substrate 14, a high intensity boron diffusion to produce a highly conductive P+ region. Above the layer 12 the assembly 16 is formed as a bridge structure in which the pillars 28 and 30 extend upwardly by being formed over intervening dielectric or resist layers in a region 82 between the layer 12 and the assembly 16 utilizing known photolithographic microfabrication procedures such as described in the above-identified patents and application.

In the case of a metallization for the assembly 16, a plating layer is first layed down on top of the layer 12 and above a spacer in the region 82 and electro-forming steps utilized thereafter to electroplate the assembly 16, the contacts 34 and 32 and the support pillars 28 and 30 as well as to form by similar bridging techniques the drive and driven electrodes 40, 42 and 36, 38 along with their contact leads and supports 50, 52, 48, 44, 46. After plating, the electro-contact underlayer is etched away leaving the isolated metal structures illustrated in FIG. 1.

In the case of polysilicon formation, again as illustrated in the above-identified applications, a similar processing sequence using photolithographic techniques is utilized except that the elements formed in metal are replaced by a sputter deposition of polysilicon in the same patterns.

The weights 74 and 76 can be formed integrally with the elements 18 and 20 or by separate formation of silicon, polysilicon, metallizations or higher density weight elements as known in the art.

Figure 3:
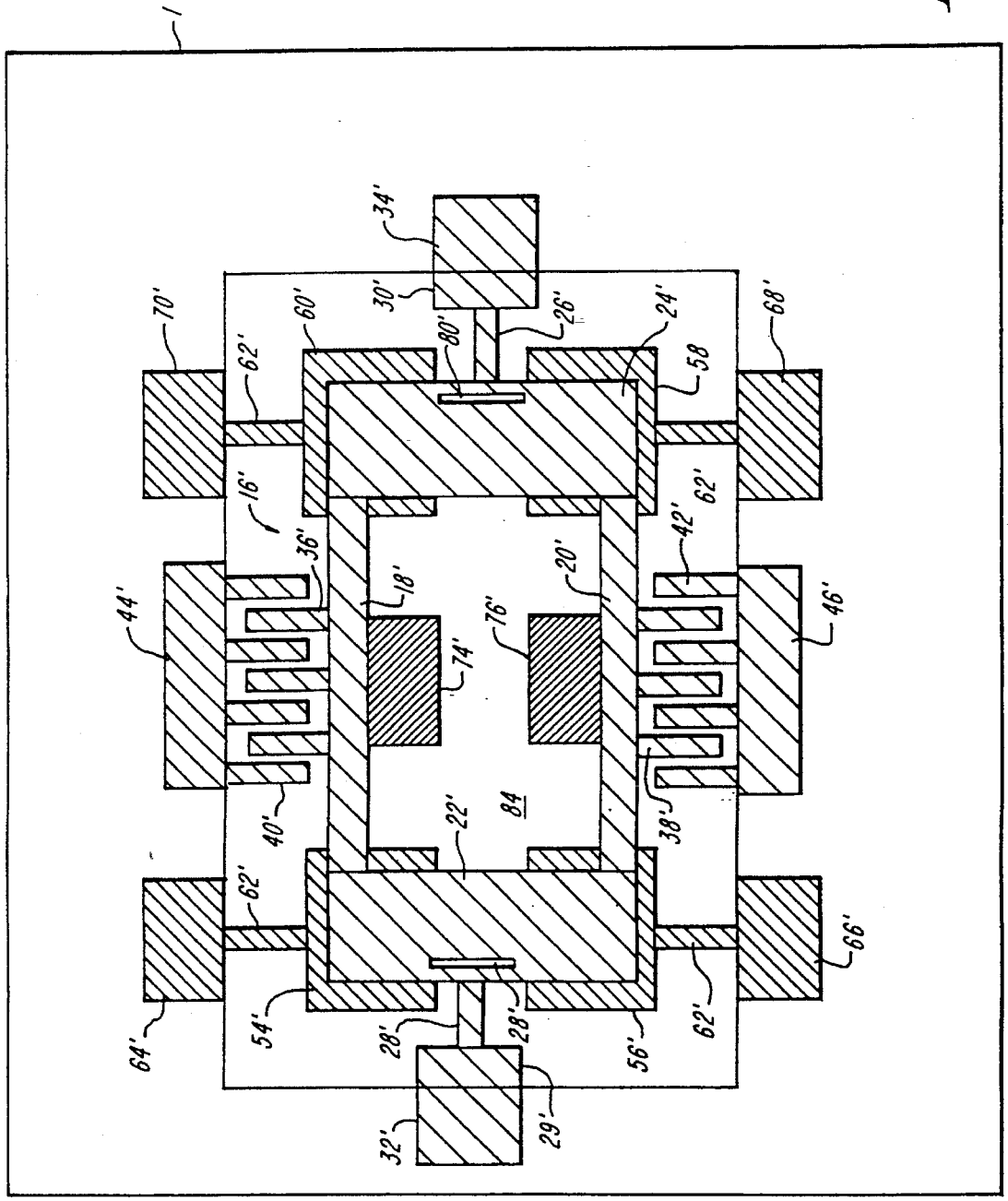
FIG. 3 is a top diagrammatic view of a comb drive vibrating tuning fork inertial rate sensor according to a second embodiment of the invention.
Figure 4:
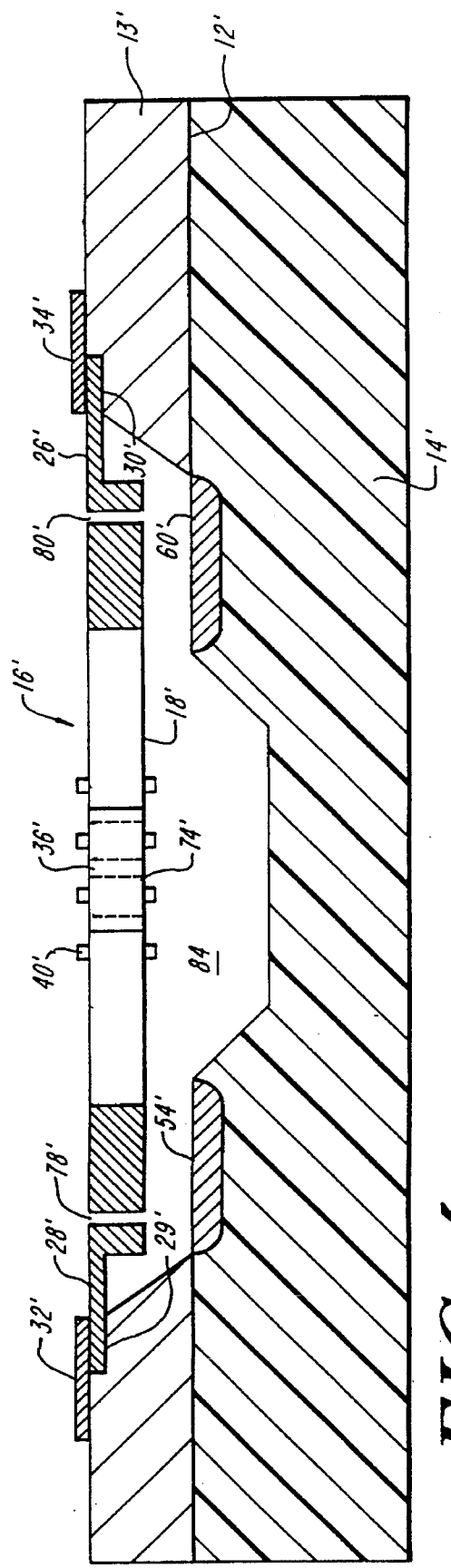
FIG. 4 is a sectional view of the embodiment of FIG. 3.

With reference to FIG. 3 a comb drive tuning fork inertial rate sensor of alternative construction is illustrated in which like elements are identified with the same numbers as used in FIG. 1, primed. The embodiment of FIG. 3, illustrated in section in FIG. 4 along similar section lines to those utilized for FIG. 2, is fabricated using micromechanical fabrication techniques and selective diffusion of boron P+ dopants in a single semiconductor chip. The substrate 14 includes, above an original surface layer 12' in which the sense electrodes 54' and 60' are diffused, an additional epitaxially grown single, or poly, silicon layer 13 in which the assembly 16' is fabricated. For that purpose, the assembly 16' is formed by selected diffusion in the pattern of the vibrating elements 18', 20', support electrodes 22', 24', driven electrodes 38', 36' as well as drive electrodes 40', 42' and electrode supports 44' and 46'. A separate, shallower diffusion is utilized for the flexures 26' and 28' as well as for their extensions and supports 29' and 30' into the epitaxially grown layer 13. Metallizations 32' and 34' are made thereover providing electrical contact through the supports 29' and 30' to the assembly 16'. After those diffusions are made, selective etching techniques are utilized to release the assembly 16' from the epitaxial layer 13 leaving a pit 84 as shown.

Figure 7:
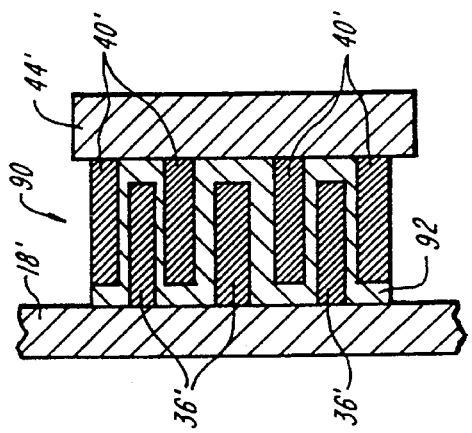
FIG. 7 is a top view illustrating the fabrication of meshing drive and driven electrodes according to an alternative fabrication technique of the invention.
Figure 6:
FIG. 6 is a sectional view of one form for electrode fabrication.

The drive and driven electrodes 36, 38 and 40, 42 and 36' 38'; 40', 42' are when fabricated by boron diffusion as illustrated in FIG. 6, of a somewhat rounded configuration shown by the diffusion 88. A sharper edge to the diffusion 6 can be provided utilizing a reactive ion etch approach as illustrated in FIG. 7 in which, for example, a single diffusion of a high density P+ boron dopant is made to form the regions 18' and 44' and an intervening zone 90. Reactive ion etching is then utilized to erode, using photolithographically exposed zigzag pattern 92, the region between what then becomes separated drive electrodes 40' and driven electrodes 36'. This allows close spacing of the drive and driven electrodes such that their capacitance is greatly increased and, importantly the variation in capacitance with relative vibrational motion between, for example, the vibrating element 18' and the drive electrode support 44'. This allows a far more effective force coupling to the vibrating elements 18, 18', 20 20'. The technology of fabrication illustrated above also permits a bulkier and thus heavier vibrating element 18, 18', 20, 20' due in part to their greater vertical extent as well as the additional mass, without an out of planar component, that can thereby be imparted to the masses 74, 74' and 76, 76'. There results an improvement in sensitivity or signal to noise ratio of the device thus fabricated.

Figure 5:
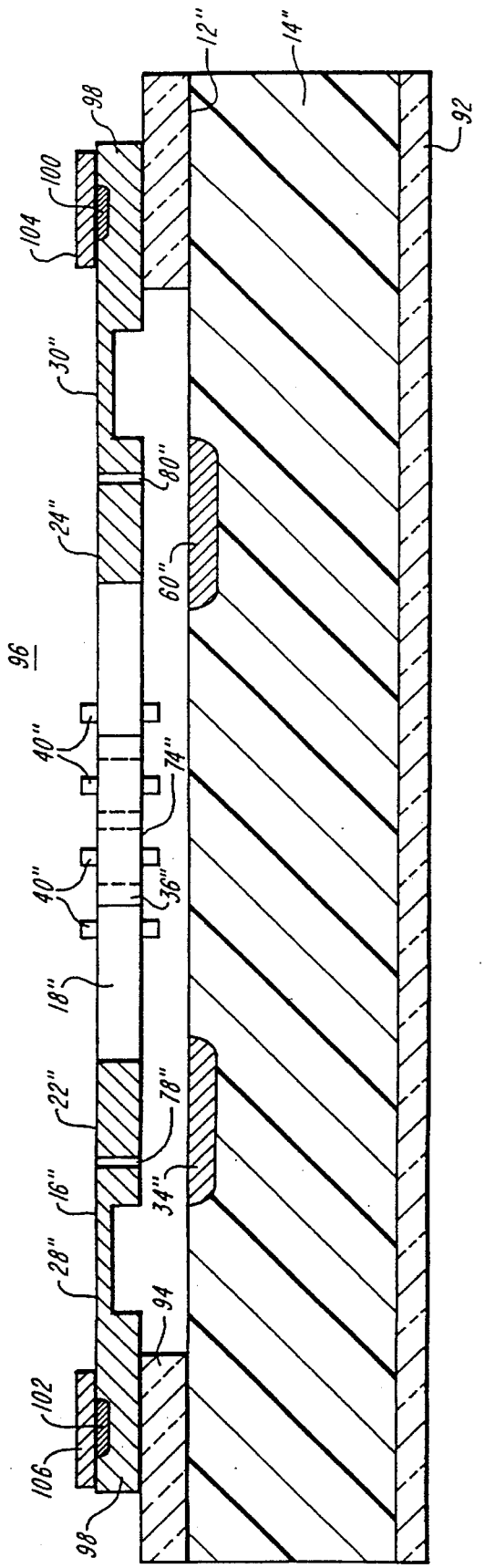
FIG. 5 is a sectional view of a yet further embodiment of the invention.

With respect to FIG. 5 there is illustrated a yet further form for the manufacture of the device, typically illustrated in top surface view in FIG. 3. This device results from the substrate welding of a first substrate 14" (utilizing similar numbers, but with a double prime, to their use elsewhere herein) which has a bottom passivation with a dielectric layer 92. The top layer 12" has sense and/or torque electrodes 54", 60" as well as those not shown formed as above. These are left exposed through an oxide layer 94 on the surface 12" of the substrate 14". At this point a second silicon substrate having a highly doped P+ layer 98 on top of a silicon substrate 96 is surface bonded to the dielectric 94. Typically, the layer 98 at the point of bonding will extend completely over the substrate 96 but is only shown in the final dimensions of the completed structure. Layer 96 is then etched away. Metallization regions 100, 102 are formed in layer 98 over which aluminized layers 104, 106 are plated to provide electrical contact to the highly doped layer 98 remaining after the substrate silicon 96 is etched away. Thereafter the layer 98 is patterned to provide the suspended assembly 16" with the vibrating elements 18', 20' support electrodes 22", 24" and flexures 28" and 30" and driven fingers 36, 36" as well as drive fingers 40", 42" and weighs 74", 76".

While various embodiments disclosed are implemented having separate electrodes for sensing and torquing, it should be appreciated that a single electrode can be used in association with each proof mass to effect both the torque and sense functions by frequency multiplexing.

Further, while closed loop systems are discussed hereinabove and in the referenced patents and applications, one of ordinary skill in the art will appreciate that various embodiments of the gyroscopic transducer disclosed can be operated open loop so as to dispense with the torque to rebalance loop. Although such operation limits dynamic range, device operation and control electronics may thusly be simplified.

Although the invention has been shown and described with respect to illustrative embodiments thereof, it should be understood by those of ordinary skill in the art that the foregoing and various other changes, additions and omissions in the form and detail thereof may be made without departing from the spirit and scope of the invention as delineated in the claims.

We claim:

1. A method for fabricating a comb drive tuning fork structure adapted for inertial rate sensitivity comprising the steps of:

providing a silicon substrate;

forming in a surface of said substrate a plurality of sense electrodes electrically isolated from each other and electrically contactable through a surface portion of said substrate;

supporting, over the surface of said substrate having said plurality of sense electrodes, by flexures for rotation about an axis through said flexures, an assembly of first and second vibratable elements supported at opposite ends by first and second support electrodes such that said vibratable elements extend either side of said axis of rotation and have, extending away therefrom, first and second sets of driven electrodes on one side and first and second respective masses on the other side;

forming on said substrate first and second drive electrodes which mesh with said first and second driven electrodes of said vibratable elements and electrical contacts for said first and second flexures.

2. The method of claim 1 wherein said supporting step includes the step of:

growing a semiconductor layer over said plurality of sense electrodes;

forming said assembly in a surface of said grown layer; and freeing said assembly from said grown layer leaving attachment thereto through said first and second flexures to allow rotation of said assembly.

3. The process of claim 2 wherein said growing step includes the step of epitaxially growing a silicon layer.

4. The process of claim 2 wherein said substrate forming step includes the step of producing etch resistant doped regions corresponding to said substrate and said first and second flexures in the surface of said grown layer.

5. The method of claim 2 wherein said freeing step includes the step of etching said grown layer except for regions defining said formed assembly.

6. The process of claim 4 wherein said etch resistant portion is created by diffusing boron into the surface of said grown layer.

7. The process of claim 1 wherein said supporting step includes the step of forming a bridge structure over the surface of silicon containing said plural sense electrodes as said assembly.

8. The process of claim 7 wherein said bridge forming step includes the step of forming the bridge structure of etch resistant polysilicon or silicon and the drive electrode forming step includes forming the drive electrodes of etch resistant polysilicon or silicon.

9. The process of claim 7 wherein both said drive electrode said bridge structure forming steps includes the steps of forming said bridge structure and drive electrodes of a metal selected from the group consisting of nickel and gold.

10. A process for forming a comb driven tuning fork structure for use in rate sensor applications comprising the steps of:

providing a silicon substrate having a planar surface;

forming in said planar surface a plurality of sense electrodes through an insulating layer aperture;

providing a second silicon substrate having a planar surface into which is diffused an etch resistant diffusant;

bonding said first and second silicon substrates planar surface to planar surface;

forming in said diffusion layer an assembly comprising flexures extending to regions of said insulating layer of said first substrate and having vibratable elements supported by electrode elements spaced parallel to each other about a rotation axis passing through said flexures with said vibratable elements having on one respective sides thereof a mass and on opposite respective sides thereof a plurality of driven electrodes in first and second sets forming separated fingers;

forming in said diffusion layer and physically separated from said assembly a plurality of drive electrodes comprising fingers fitting between the fingers of said driven electrodes.

11. The process of claim 1 wherein said supporting step includes the steps of:

providing a second silicon substrate having a planar surface with a layer of etch resistant diffusion therein;

forming a dielectric layer over said first mentioned silicon substrate surrounding said plurality of sensor electrodes;

bonding said diffusion layer to said dielectric layer of said second and first substrates respectively;

said assembly being formed in said diffusion layer in portions overlying said plurality of sense electrodes by selective etching of said second silicon substrate diffusion layer.

12. The process of claims 10 or 11 further including the step of eliminating substantially all of said second semiconductor substrate in the region of said assembly.

13. The process of claim 12 further comprising the step of providing a metallized electrical contact to said assembly.

14. The process of claims 1 or 10 further including the step of forming at least one of said driven and drive electrode fingers by the steps of:

forming electrically conducting regions in said assembly in the regions for said drive and driven electrodes; and dimensioning edges of said conductive regions by reactive ion etching to separate said drive and driven electrodes.

* * * * *